(12) United States Patent
Choi et al.

(10) Patent No.: US 6,291,119 B2
(45) Date of Patent: Sep. 18, 2001

(54) METHOD OF COMPENSATING FOR PATTERN DIMENSION VARIATION CAUSED BY RE-SCATTERED ELECTRON BEAM IN ELECTRON BEAM LITHOGRAPHY AND RECORDING MEDIUM IN WHICH THE METHOD IS RECORDED

(75) Inventors: Ji-hyeon Choi, Eunpyung-gu; Won-tai Ki, Seodaemun-gu, both of (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/758,708

(22) Filed: Jan. 11, 2001

(30) Foreign Application Priority Data

Jan. 12, 2000 (KR) .................................................. 00-1337

(51) Int. Cl.[7] ................................. G03F 9/00; G03C 5/00
(52) U.S. Cl. ............................. 430/30; 430/296; 430/942
(58) Field of Search .............................. 430/30, 296, 942

(56) References Cited

U.S. PATENT DOCUMENTS 5,935,744 * 8/1999 Nakajima ............................. 430/296

OTHER PUBLICATIONS

Norio Saitou, et al., "Multiple Scattered E-beam Effect in Electron Beam Lithography," SPIE vol. 1465 pp.185–191, 1991.

Naoharu Shimomura, et al., "Reduction of Fogging Effect Caused by Scattered Electron in an Electron Beam System," SPIE vol. 3748, pp. 125–132, 1999.

* cited by examiner

*Primary Examiner*—Christopher G. Young
(74) *Attorney, Agent, or Firm*—Mills & Onello LLP

(57) ABSTRACT

The present invention relates to electron beam lithography, and is directed to a method of compensating for pattern dimension variation caused by a re-scattered electron beam when an electron beam resist is exposed to the electron beam. The method of compensating for pattern dimension variation caused by a re-scattered electron beam comprises the steps of: dividing original exposure pattens into square sections; obtaining a dose of supplemental exposure to the re-scattered electron beam; and compensation-exposing the electron beam resist so that the supplemental exposure dose may be the same for all sections. According to the present invention, the pattern dimension variation can be compensated for a re-scattering effect of the electron beam, thereby uniformly forming a fine pattern width of a more highly-integrated circuit.

12 Claims, 7 Drawing Sheets

METHOD OF COMPENSATING FOR PATTERN DIMENSION VARIATION CAUSED BY RE-SCATTERED ELECTRON BEAM IN ELECTRON BEAM LITHOGRAPHY AND RECORDING MEDIUM IN WHICH THE METHOD IS RECORDED

BACKGROUND OF THE INVENTION

1. Field of the Invention

The present invention relates to electron beam lithography, and more particularly, to a method of compensating for pattern dimension variation caused by a re-scattering effect of the electron beam occurring when a resist is exposed to the electron beam.

2. Description of the Related Art

Electron beam lithography is a technique used in patterning a material layer formed on a substrate in a desired pattern. This entails the process of coating an electron beam resist on a material layer; writing a desired pattern with an electron beam (referred to in the art as an "exposure"); developing the electron beam resist; and etching the material layer by using the electron beam resist pattern formed using the desired pattern as a mask. Electron beam lithography can be used to form a predetermined material layer pattern directly forming an integrated circuit on the substrate, however, in general, electron beam lithography is used to fabricate a photomask for use in photolithography.

Referring to FIG. 1, the process for fabricating the photomask will be described in greater detail. The process comprises the steps of: coating an electron beam resist 130 on an opaque film 120 (in the case of a phase shift mask, a phase shifting layer is available, hereinafter described simply as an opaque film) formed on a transparent substrate 110; writing a desired pattern with an electron beam 150; developing the electron beam resist 130 by using a difference of solubility depending on writing of the electron beam; and etching the opaque film 120 by using the formed resist pattern as a mask.

However, the electron beam 150 does not only expose the desired portion of the electron beam resist 130, as the electron beam 150 is reflected on the surface of the opaque film 120 or scattered by collisions with atoms of a resist material in the electron beam resist 130 as marked 170 in FIG. 1. Also, the electron beam 150 is reflected in the electron beam resist 130 or on the surface of the electron beam resist 130 and at the lower plane of an objective lens 140 of an electron beam writer and, as a consequence, the electron beam 150 exposes an undesired portion of the electron beam resist 130 as marked 160 in FIG. 1.

A quantity (a dose) by which the electron beam resist 130 is exposed an extra amount by scattering of the electron beam 150 as described above, is shown in FIG. 2. As shown in FIG. 2, the electron beam resist can be additionally exposed from a region in which a pattern is written with the electron beam, that is, from an edge of the pattern to a maximum distance of 10 cm. Close to the edge of the pattern, the dose can be as high as 25% of the original exposure dose. In FIG. 2, an additional exposure 210 affecting from the region in which a pattern is written with the electron beam, to approximately 10 µm, is caused by forward scattering and backward scattering of the electron beam indicated by reference numeral 170 in FIG. 1, and an additional exposure 220 affecting to approximately 10 cm is caused by re-scattering of the electron beam indicated by reference numeral 160 in FIG. 1. In conclusion, these additional exposures deteriorate the accuracy of the opaque film pattern, and cause a critical dimension (CD) error. The pattern dimension variation caused by the former additional exposure 210 is referred to as a proximity effect, and the pattern dimension variation caused by the latter additional exposure 220 is referred to as a re-scattering effect (multiple scattering effect or a fogging effect) of the electron beam.

The re-scattering effect of the electron beam affects a wide range (Considering the integration of a current integrated circuit, 10 cm is a very wide range.), and since a dose caused by the additional exposure 220 is relatively small, the effect has not been ascertained, and no compensation method is well-known. However, the pattern dimension variation of the photomask caused by the re-scattering effect of the electron beam is estimated to be about 10~20 nm when an electron beam dose is 8 $\mu C/cm^2$ at an accelerating voltage of 10 keV, and the pattern dimension variation of the photomask greatly affects the manufacture of more highly-integrated circuits.

On the other hand, the re-scattering effect of the electron beam is introduced, and a method for forming the lower plane of the objective lens in which the re-scattered electron beam is reflected, of a material with a low atomic number, as a method for reducing this effect is disclosed in, Norio Saitou et al., "Multiple Scattered E-beam Effect in Electron Beam Lithography", SPIE Vol. 1465, pp. 185–p. 191, 1991. That is, it is reported in the paper that an additional dose caused by the re-scattering effect of the electron beam when the lower plane of the objective lens is formed of copper, aluminum, and carbon, respectively, was measured, and the re-scattering effect of the electron beam was lowest when carbon was adopted. However, it is shown in FIG. 2 that the re-scattering effect is not remarkably reduced even if carbon is adopted. In FIG. 2, the chart of symbol "○" applies to the case where aluminum is adopted, and the chart of symbol "□" applies to the case where carbon is adopted.

Also, a method for reducing the re-scattering effect by absorbing the re-scattered electron beam by attaching an absorber plate in which a honeycomb groove is formed at the lower plane of the objective lens, is disclosed in Naoharu Shimomura et al., "Reduction of Fogging Effect caused by Scattered Electron in an Electron Beam System", SPIE Vol. 3748, pp. 125–p. 132, 1999. However, it is also not possible for all re-scattered electrons to be absorbed by this method, and there is a limitation in reducing the re-scattering effect.

SUMMARY OF THE INVENTION

To address the above limitation, it is an object of the present invention to provide a method of compensating for pattern dimension variation caused by a re-scattering effect of an electron beam.

Accordingly, to achieve the above object, there is provided a method of compensating for pattern dimension variation caused by a re-scattered electron beam, the method comprising the steps of: dividing original exposure patterns into square sections; determining a dose of additional exposure (referred to herein as a "supplemental exposure dose") to the re-scattered electron beam for each section; and compensating the electron beam resist so that the supplemental exposure dose may be the same for all sections. That is, the method of compensating for pattern dimension variation caused by a re-scattered electron beam comprises the steps of: dividing original exposure pattens into square sections; determining a dose of supplemental exposure to the re-scattered electron beam when adjacent sections are exposed, for each section; determining a compensation exposure dose for each section by deducting supplemental exposure doses of each section from a predetermined reference value; and compensation-exposing the electron beam resist according to the compensation exposure dose of each section.

The method of compensating for pattern dimension variation caused by a re-scattering effect of an electron beam according to the present invention can be provided in the form of a recording medium on which a program to be read and performed by a commercial computer is recorded. That is, a recording medium on which a program for obtaining compensation exposure data for compensating pattern dimension variation is recorded includes a program module for dividing original exposure patterns into square sections and determining a dose of supplemental exposure to the re-scattered electron beam when adjacent sections are exposed, for each section, a program module for determining a compensation exposure dose for each section by deducting the supplemental exposure dose of each section from a predetermined reference value, and a program module for setting-up compensation exposure patterns for each section with predetermined compensation exposure patterns so as to expose an area proportional to the compensation exposure dose for each section.

According to the present invention, pattern dimension variation caused by a re-scattering effect of an electron beam can be compensated for, thereby uniformly forming a fine pattern of a more highly-integrated circuit.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1:
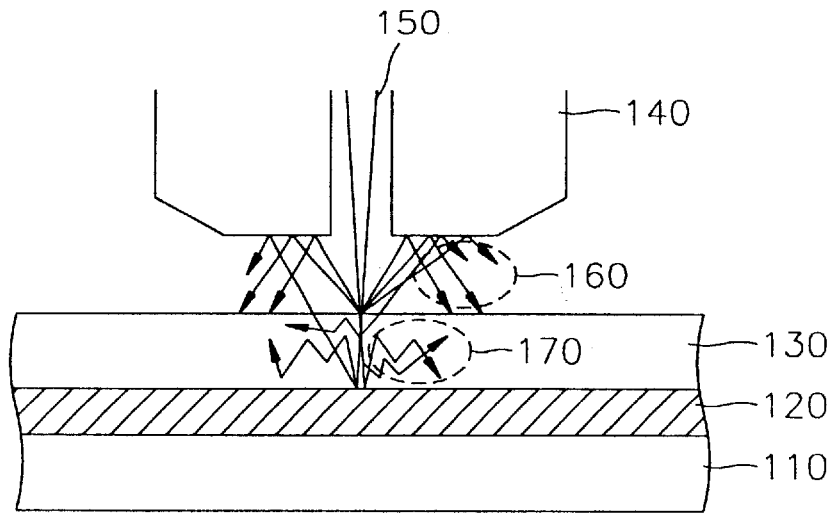
FIG. 1 is a sectional view illustrating a scattering phenomenon of an electron beam when the electron beam is incident on an electron beam resist.
Figure 3:
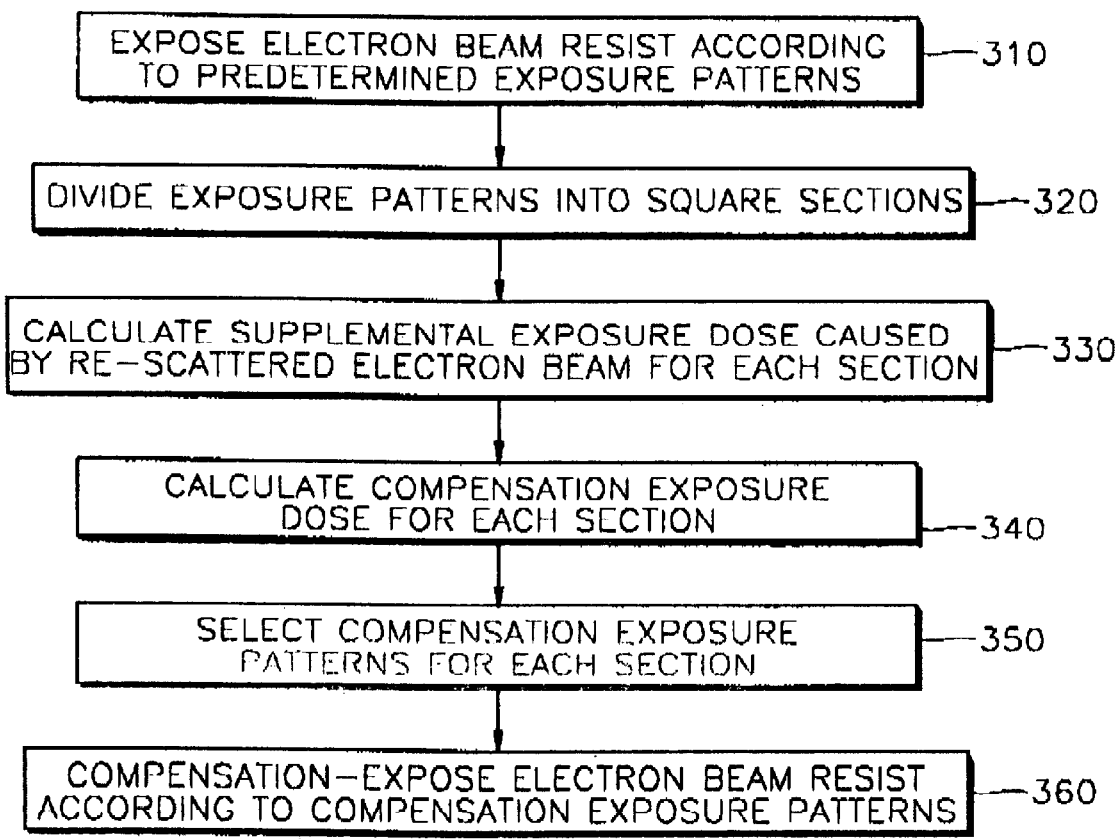
FIG. 3 is a flow chart illustrating steps of compensating for pattern dimension variation caused by a re-scattered electron beam, according to an embodiment of the present invention.
Figure 4:
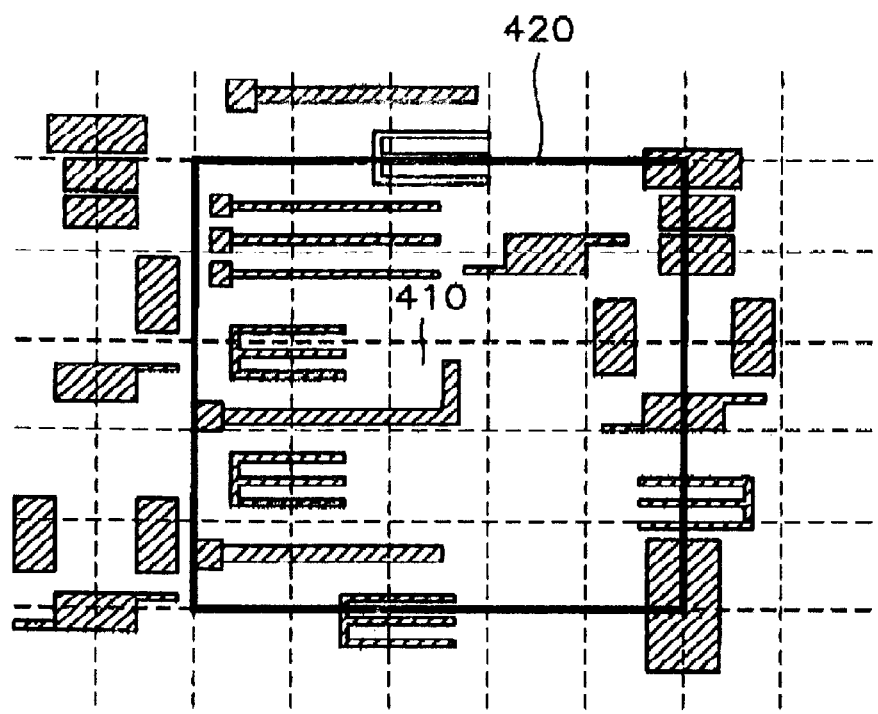
FIG. 4 is a layout diagram illustrating steps of dividing predetermined exposure patterns into sections according to an embodiment of the present invention.

FIG. 3 is a flow chart illustrating steps of compensating for pattern dimension variation caused by a re-scattered electron beam, according to the present invention. First, an electron beam resist is exposed to an electron beam according to predetermined exposure patterns (step 310). Referring back to FIG. 1, an electron beam resist 130 is coated on an opaque film 120 formed on a transparent substrate 110, and a desired pattern is written with the electron beam. In other words, the electron beam exposure of the step 310 corresponds to a general exposure step, and here, a region not to be exposed to the electron beam is additionally exposed. Here, the desired pattern, for example, may be predetermined material layer patterns as shown in FIG. 4, and the layout of the desired pattern is converted into data form suitable for an electron beam exposure, and is supplied to an electron beam writer. In FIG. 4, the material layer patterns to be actually formed by a follow-up photolithographic process correspond to oblique-lined portions, and a portion exposed by the electron beam corresponds to the oblique-lined portions of FIG. 4 when a photoresist to be used in the follow-up photolithographic process is a negative-type photoresist and in case of a positive-type photoresist, the portion corresponds to a portion excluding the oblique-lined portions of FIG. 4. Hereinafter, for convenience of explanation, it is assumed that the resists to be used as the electron beam resist and in the follow-up photolithographic process are both positive-type resists.

Returning to FIG. 3, during step 320 exposure patterns, such as those shown in FIG. 4, are divided into square sections 410. In step 330, a supplemental exposure dose caused by the re-scattered electron beam is calculated when adjacent sections are exposed, for each section 410. The step of calculating the supplemental exposure dose for each section 410 can be subdivided as described below.

First, an exposure pattern density is calculated for each section. As described above, in a case where the photoresist to be used in the follow-up photolithographic process is a positive-type photoresist, the portion exposed by the electron beam to actually fabricate the photomask corresponds to a portion excluding the oblique-lined portions of FIG. 4, and in a case where no oblique-lined portions are included in a section 410, the exposure pattern density of the section is 1, and on the contrary, in a case where a section is formed of the oblique-lined portions, the exposure pattern density of the section is 0. That is, the exposure pattern density of each section is the fraction of the area of a section not occupied by oblique-lined portions.

The supplemental exposure doses are calculated for each section using the following equation after the exposure pattern density is calculated for each section:

$$\delta_{i,j} = \sum_{x=-\xi}^{\xi} \sum_{y=-\xi}^{\xi} D_{i+x,j+y} e^{-\frac{x^2+y^2}{\xi^2}} \quad (1)$$

wherein $\delta_{i,j}$ is a supplemental exposure dose of a section with x-coordinate i and y-coordinate j, $\xi$ is a re-scattering range, and $D_{i,j}$ is an exposure pattern density of the section with x-coordinate i and y-coordinate j.

The above equation 1 will be described in detail below. For example, in a case where the re-scattered electron beam affects the edge of a window 420 indicated by a thick solid line when a portion of the most centered section 410 in FIG.

4 is exposed, the re-scattering range ξ is 2, and in order to calculate the supplemental exposure dose of the most centered section 410, the supplemental exposure doses caused by the re-scattering effect of the electron beam when each section contained in the window 420 is exposed, are added. Also, the supplemental exposure dose of each section caused by the re-scattering effect when exposing are proportional to the exposure pattern density of the section and inversely proportional to the distance from the most centered section 410.

Figure 2:
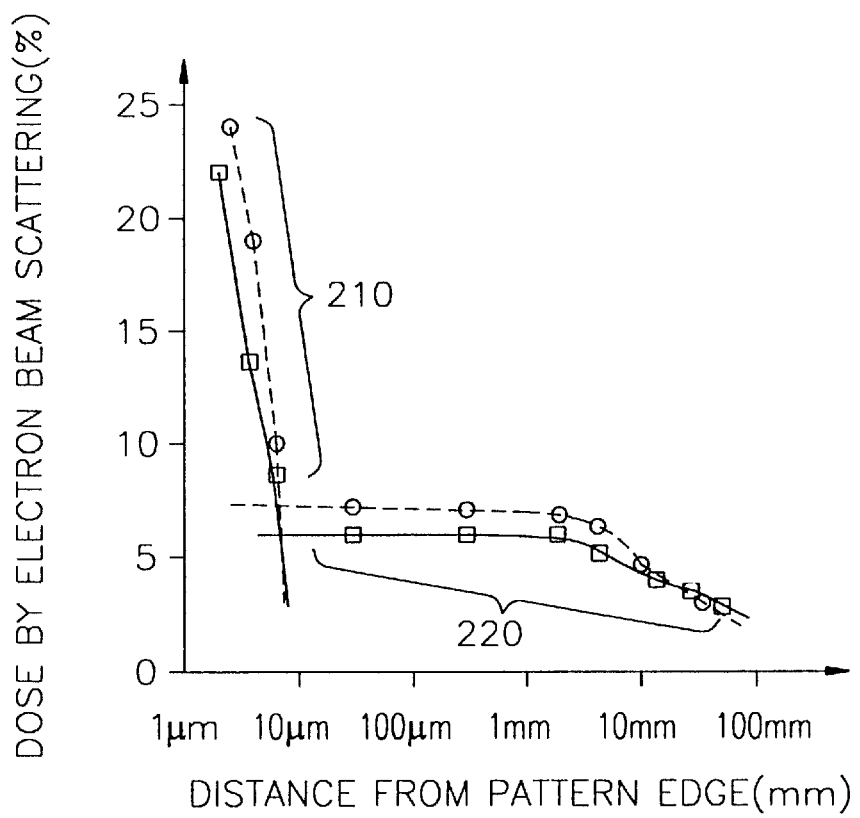
FIG. 2 is a graph of dose of supplemental exposure to a scattered electron beam versus distance from the edge of a pattern.
Figure 5:
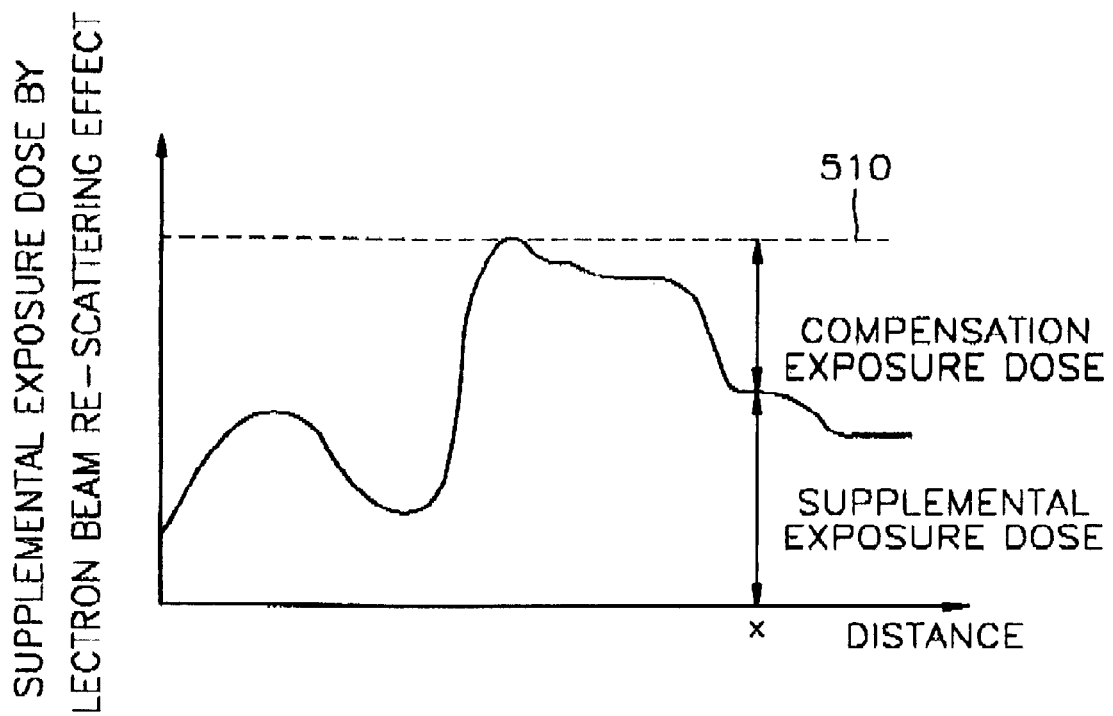
FIG. 5 is a graph illustrating the manner in which compensation exposure dose to compensate for pattern dimension variation caused by a re-scattered electron beam is determined, according to an embodiment of the present invention.

Returning to FIG. 3, after obtaining the supplemental exposure doses with respect to all sections, compensation exposure doses are calculated for each section (step 340). The compensation exposure doses are doses that compensate such that the supplemental exposure dose caused by the re-scattering effect of the electron beam may be constant with respect to all sections. The supplemental exposure dose of each section are deducted from a predetermined reference value. Here, the predetermined reference value may be a maximum value of the supplemental exposure dose with respect to all sections, calculated in the step 330, or the predetermined reference value may be otherwise appropriately designated. That is, as shown in FIG. 2, since the supplemental exposure doses caused by the re-scattering effect of the electron beam are approximately less than 6% when carbon is used for the lower plane material of an objective lens, a maximum supplemental exposure dose may be set up as 6% of the original exposure (step 310) dose. Meanwhile, in a case where the reference value is the maximum value of the supplemental exposure dose, as shown in FIG. 5, the compensation exposure dose of a section x is obtained by deducting the supplemental exposure doses of the section from the maximum supplemental exposure dose 510.

Subsequently, a compensation exposure is performed according to the compensation exposure dose obtained for each section. In detail, a predetermined compensation exposure pattern is selected according to the compensation exposure dose for each section (step 350), and compensation exposure data are established by gathering the selected compensation exposure pattern for each section, and the electron beam resist is exposed by the electron beam according to these compensation exposure data (step 360).

Figure 6:
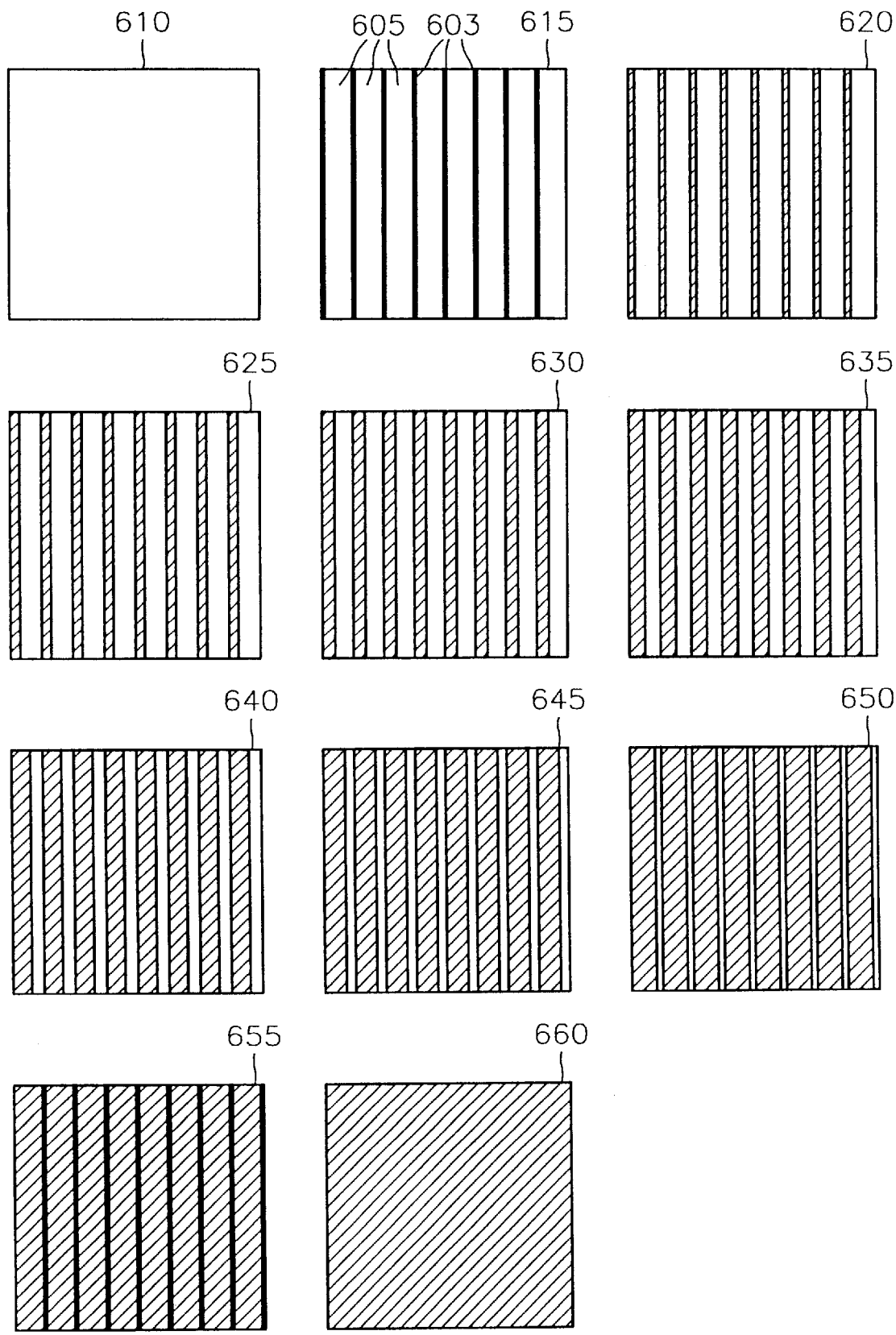
FIG. 6 and FIG. 7 illustrate examples of compensation exposure patterns according to an embodiment of the present invention.
Figure 7:
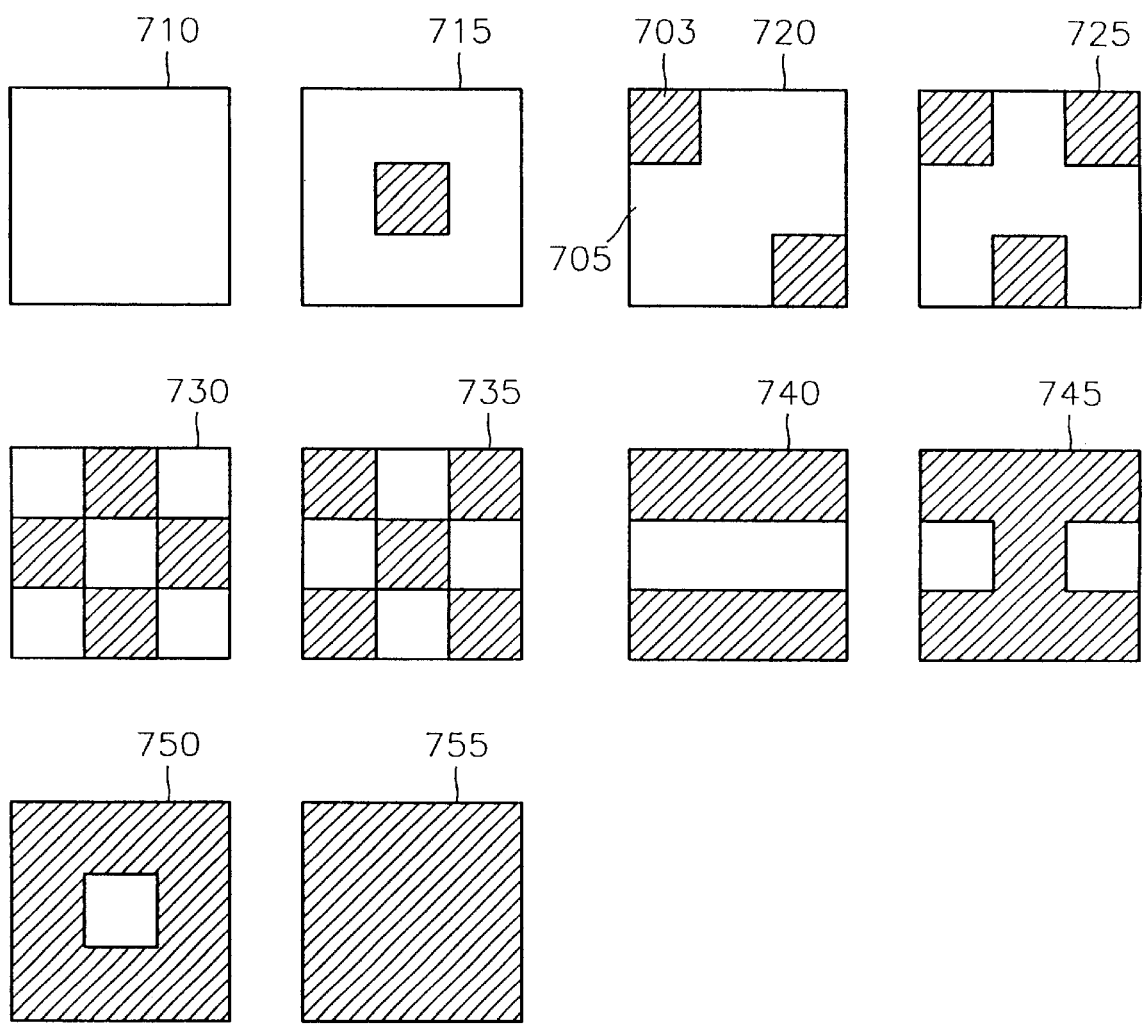

In FIGS. 6 and 7, which illustrate examples of compensation exposure patterns which can be selected, oblique-lined portions 603 and 703 of FIGS. 6 and 7 denote portions compensation-exposed by the electron beam. In the compensation exposure patterns, portions exposed according to the compensation exposure dose of each section become stepwise broad, and the compensation exposure patterns of FIG. 6 are classified into 11 stages, and those of FIG. 7 into 10 stages. The selection of the compensation exposure patterns of FIGS. 6 and 7 according to the compensation exposure dose for each section is done according to tables 1 and 2, respectively: In tables 1 and 2, $\delta_{i,j}$ is a compensation exposure dose of a section with x-coordinate i and y-coordinate j, and $\delta_{max}$ is the above-mentioned maximum supplemental exposure dose.

TABLE 1

| Compensation exposure dose | Open ratio of compensation exposure pattern (%) | Compensation exposure pattern |
|---|---|---|
| $\delta'_{i,j} < 0.05\ \delta_{max}$ | 0 | 610 |
| $0.05\ \delta_{max} \leq \delta'_{i,j} < 0.15\ \delta_{max}$ | 10 | 615 |

TABLE 1-continued

| Compensation exposure dose | Open ratio of compensation exposure pattern (%) | Compensation exposure pattern |
|---|---|---|
| $0.15\ \delta_{max} \leq \delta'_{i,j} < 0.25\ \delta_{max}$ | 20 | 620 |
| $0.25\ \delta_{max} \leq \delta'_{i,j} < 0.35\ \delta_{max}$ | 30 | 625 |
| $0.35\ \delta_{max} \leq \delta'_{i,j} < 0.45\ \delta_{max}$ | 40 | 630 |
| $0.45\ \delta_{max} \leq \delta'_{i,j} < 0.55\ \delta_{max}$ | 50 | 635 |
| $0.55\ \delta_{max} \leq \delta'_{i,j} < 0.65\ \delta_{max}$ | 60 | 640 |
| $0.65\ \delta_{max} \leq \delta'_{i,j} < 0.75\ \delta_{max}$ | 70 | 645 |
| $0.75\ \delta_{max} \leq \delta'_{i,j} < 0.85\ \delta_{max}$ | 80 | 650 |
| $0.85\ \delta_{max} \leq \delta'_{i,j} < 0.95\ \delta_{max}$ | 90 | 655 |
| $0.95\ \delta_{max} \leq \delta'_{i,j} < 1.0\ \delta_{max}$ | 100 | 660 |

TABLE 2

| Compensation exposure dose | Open ratio of compensation exposure pattern (%) | Compensation exposure pattern |
|---|---|---|
| $\delta'_{i,j} < 0.05\ \delta_{max}$ | 0 | 710 |
| $0.05\ \delta_{max} \leq \delta'_{i,j} < 0.16\ \delta_{max}$ | 1/9 | 715 |
| $0.16\ \delta_{max} \leq \delta'_{i,j} < 0.27\ \delta_{max}$ | 2/9 | 720 |
| $0.27\ \delta_{max} \leq \delta'_{i,j} < 0.38\ \delta_{max}$ | 3/9 | 725 |
| $0.38\ \delta_{max} \leq \delta'_{i,j} < 0.49\ \delta_{max}$ | 4/9 | 730 |
| $0.49\ \delta_{max} \leq \delta'_{i,j} < 0.60\ \delta_{max}$ | 5/9 | 735 |
| $0.60\ \delta_{max} \leq \delta'_{i,j} < 0.71\ \delta_{max}$ | 6/9 | 740 |
| $0.71\ \delta_{max} \leq \delta'_{i,j} < 0.82\ \delta_{max}$ | 7/9 | 745 |
| $0.82\ \delta_{max} \leq \delta'_{i,j} < 0.93\ \delta_{max}$ | 8/9 | 750 |
| $0.93\ \delta_{max} \leq \delta'_{i,j} < 1.0\ \delta_{max}$ | 1 | 755 |

The maximum dose during compensation-exposing (step 360) is preferably a sufficiently small value (for example, less than 6%) compared to that at the original exposure (step 310), preferably, however, the compensation exposure time is comparatively short, for example less than 30 minutes (exposure time at the original exposure is generally several hours.), so that the compensation exposure patterns of FIGS. 6 and 7 are not actually formed on the photomask.

Figure 8:
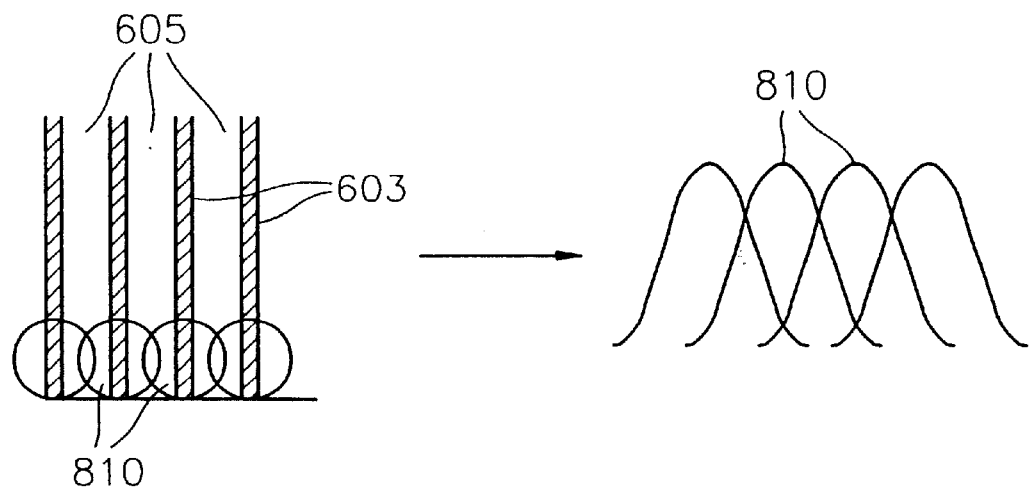
FIG. 8 illustrates the size of an electron beam spot when compensation exposing according to an embodiment of the present invention.

Also, as shown in FIG. 8, preferably, a spot size 810 of the electron beam when compensation-exposing is several times greater than a line width of the compensation exposure patterns 603 so that the spot 810 overlaps unexposed portions 605.

When the compensation exposure is performed in this way, the supplemental exposure dose caused by the re-scattering effect of the electron beam at each section becomes constant, thereby the pattern dimension variation of the photomask is prevented.

In the above-mentioned embodiment, the method according to the present invention is applied to the fabrication of the photomask. However, in alternative embodiments, the method of the present invention can be applied to the patterning of a predetermined material layer formed on a substrate so as to construct an integrated circuit.

Hereinafter, experimental examples in which the pattern line width variation when the compensation exposure is performed according to the method of the present invention will be described, in comparison to an example in which the compensation exposure is not performed.

Figure 9:
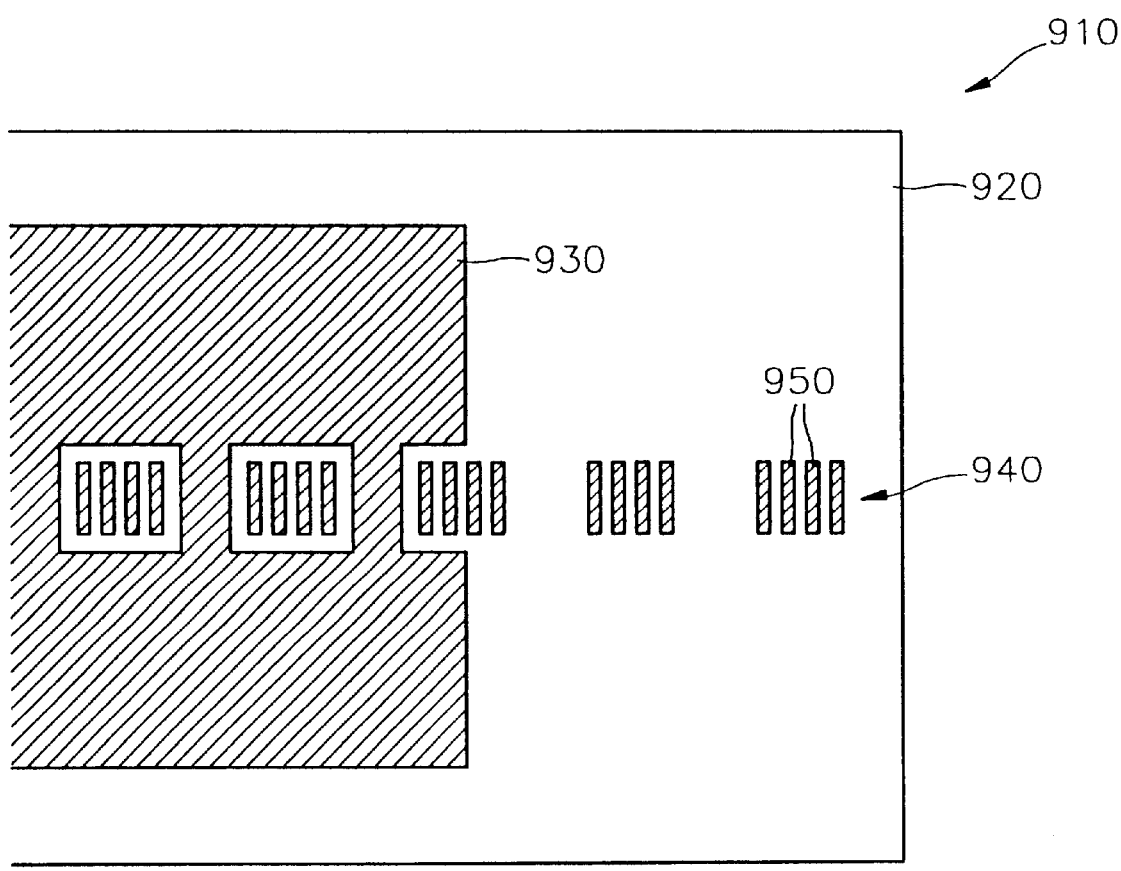
FIG. 9 is a layout diagram illustrating exposure patterns used for an experiment in compensating for pattern dimension variation caused by the re-scattered electron beam, according to an embodiment of the present invention.

First, as shown in FIG. 9, an exposure pattern 910 of a 70 mm×70 mm size in which a test pattern 940, in which linear patterns 950 having a predetermined line width are arranged is formed, is provided. In FIG. 9, oblique-lined regions 930 and 950 correspond to an opaque film pattern, and a blank region 920 corresponds to a portion exposed to the electron beam.

Figure 10:
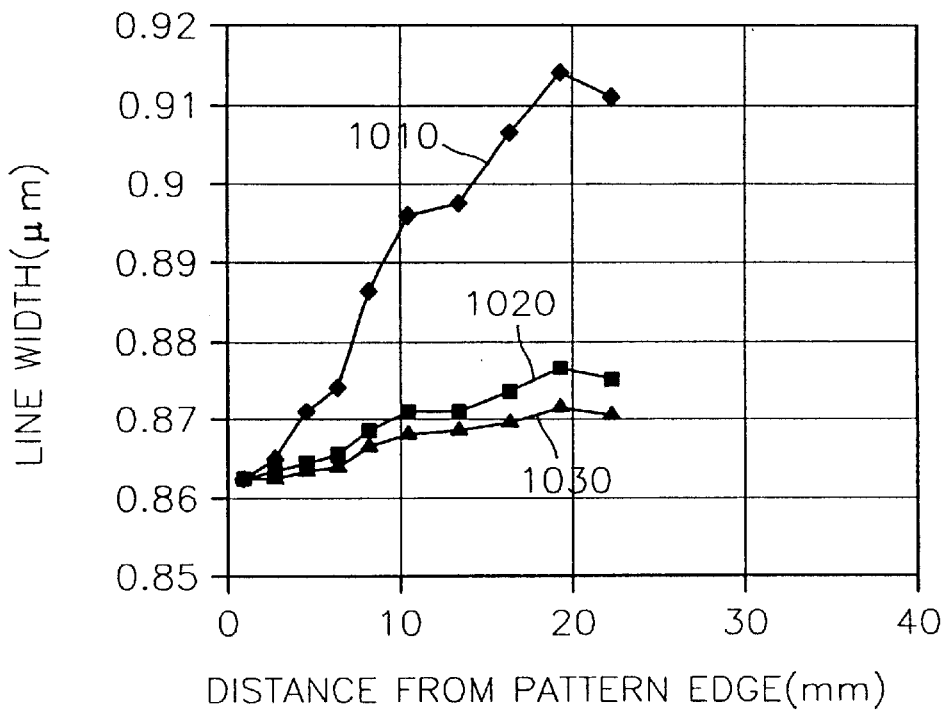
FIG. 10 and FIG. 11 are graphs of a line width before compensating for pattern dimension variation and a line width after compensating for pattern dimension variation according to the present invention, versus distance from the edge of a pattern, respectively.

FIG. 10 is a graph in which a line width of the test pattern 910 (see FIG. 9) is measured, following a general exposure to the electron beam (step 310). In the graph of FIG. 10, the horizontal axis denotes distance to an unexposed area 930 from a boundary between a 100% exposed area (the non-oblique-lined area 920 of FIG. 9) and the unexposed area (the oblique-lined area 930), and the vertical axis denotes a measured line width of the test pattern. Reference numeral 1010 denotes a line width when exposing at an accelerating voltage of 50 keV and a dose of 32 $\mu$C/cm$^2$, and reference numeral 1020 denotes a line width when exposing at an accelerating voltage of 10 keV and a dose of 8 $\mu$C/cm$^2$. Also, reference numeral 1030 denotes a line width when exposing at an accelerating voltage of 10 keV and a dose of 8 $\mu$C/cm$^2$ and converting the 100% exposed area 920 of FIG. 9 into an area having an average exposure pattern density of 70% with a similar level to that of a conventional integrated circuit device.

Referring to FIG. 10, variation widths of line widths, that is, differences in a maximum line width and a minimum line width are 53 nm(1010), 15 nm(1020), and 10 nm(1030), respectively. Also, the variation of the line widths including the variation of the line widths at the test pattern 940 of the 100% exposed area 920, are measured as 87 nm(1010), 22 nm(1020), and 15 nm(1030), respectively.

Following this, the compensation exposure was performed according to the method of compensating for pattern dimension variation caused by the re-scattered electron beam of the present invention. That is, the exposure pattern 910 of, for example, 70 nm×70 nm of FIG. 9 is divided into the sections of, for example, 1 mm×1 mm, and the exposure pattern density and the supplemental exposure dose with respect to each section are determined.

Here, the re-scattering range $\xi$ is set up as 8 mm, and the maximum supplemental exposure dose value $\delta_{max}$ is set up as 3.5% of the original exposure dose. After obtaining the compensation exposure dose for each section, the line widths of the test pattern formed by the compensation exposure according to the compensation exposure doses are measured.

Figure 11:
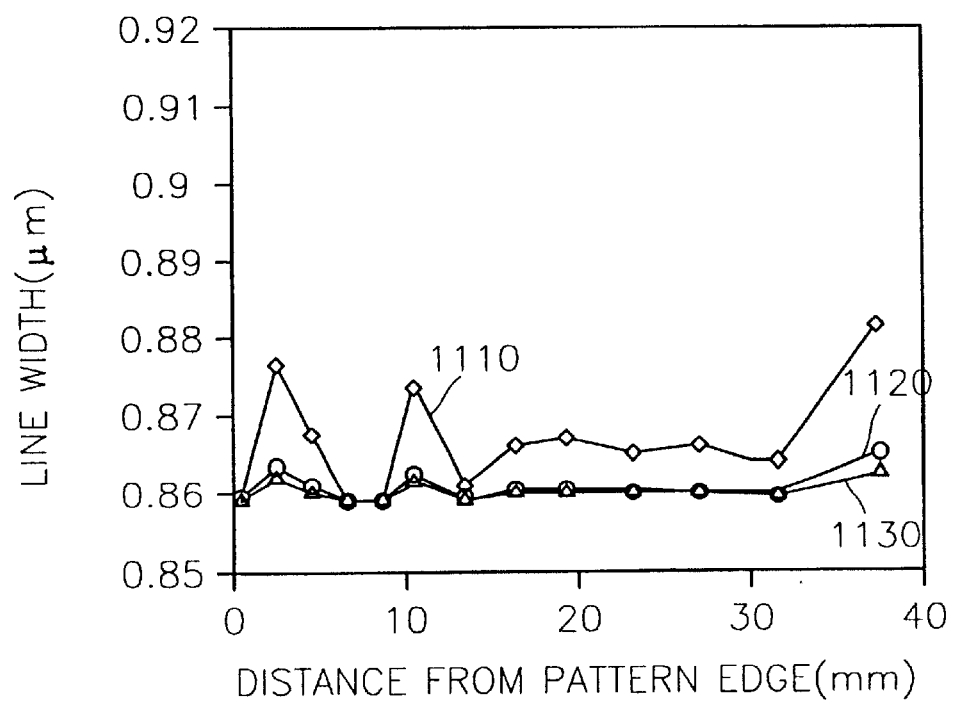

Referring to FIG. 11, a graph illustrating the above measured results, the horizontal and vertical axes are the same as those of FIG. 10, and reference numerals 1110, 1120, and 1130 denote measured line widths corresponding to 1010, 1020, and 1030 of FIG. 10, respectively. In FIG. 11, in the cases of 1110, 1120, and 1130, the variation widths of the line widths are remarkably reduced compared to those of FIG. 10. The variation widths of the line width including the variation of the line widths at the test pattern 940 of the 100% exposed area 920, are measured as 23 nm(1110), 6 nm(1120), and 4 nm(1130), respectively.

Meanwhile, the method of compensating for a pattern dimension variation caused by the re-scattered electron beam of the present invention may be realized by a software program, and the program may be provided on computer readable media. Therefore, the method of compensating for pattern dimension variation of the present invention can be performed by a general-purpose digital computer. The media can include storage media such as magnetic media (for example, a read-only memory (ROM), a floppy disk, and a hard disk etc.), optical media (for example, CD-ROM and a digital versatile-disc (DVD) etc.), and carrier waves (for example, transfer via Internet).

In general, the exposure patterns as shown in FIG. 4 are converted into exposure data for writing with an electron beam and supplied to the electron beam writer, the compensation exposure patterns of FIGS. 6 or 7 obtained by the method of the present invention are also supplied to the electron beam writer as the compensation exposure data. In particular, all steps of the method of the present invention, that is, the steps of: dividing original exposure patterns (FIG. 4) into predetermined-size sections and determining a dose of supplemental exposure by the re-scattered electron beam for each section; obtaining a compensation exposure dose for each section; and selecting predetermined compensation exposure patterns according to the compensation exposure dose for each section and establishing compensation exposure data with respect to entire exposure patterns, can be essentially realized by modules of a computer program, and it is also preferable for the steps to be realized by the computer program. Here, codes and code segments of a functional program, in which each program module is actually coded, can be readily implemented by a skilled computer programmer.

As described above, according to the present invention, the exposure patterns are preferably divided into square sections, and the supplemental exposure dose caused by the re-scattering effect of the electron beam and the compensation exposure dose are determined for each section. The electron beam resist is compensation-exposed according to predetermined compensation exposure patterns according to the compensation exposure dose for each section, thereby minimizing the pattern dimension variation caused by the re-scattering effect of the electron beam.

The method of compensating for pattern dimension variation caused by the re-scattering effect of the electron beam of the present invention can be realized by a computer program and performed in a general-purpose digital computer, thereby minimizing the pattern dimension variation caused by the re-scattered electron beam in an electron beam exposure system.

What is claimed is:

1. A method of compensating for pattern dimension variation caused by a re-scattered electron beam when an electron beam resist is exposed to the electron beam at predetermined exposure patterns, the method comprising:

dividing the predetermined exposure patterns into square sections;

determining a dose of supplemental exposure to the re-scattered electron beam when adjacent sections are exposed, for each section;

determining a compensation exposure dose for each section by deducting the supplemental exposure dose of each section from a predetermined reference value; and compensation-exposing the electron beam resist according to the compensation exposure dose of each section.

2. The method of compensating for pattern dimension variation caused by a re-scattered electron beam according to claim 1, wherein the step of determining the supplemental exposure dose for each section comprises:

obtaining an exposure pattern density of each section; and obtaining the supplemental exposure dose for each section according to the relationship:

$$\delta_{i,j} = \sum_{x=-\xi}^{\xi} \sum_{y=-\xi}^{\xi} D_{i+x,j+y} e^{-\frac{x^2+y^2}{\xi^2}}$$

wherein $\delta_{i,j}$ is the supplemental exposure dose of a section with x-coordinate i and y-coordinate j, and $\xi$ is a re-scattering range, and $D_{i,j}$ is an exposure pattern density of a section with x-coordinate i and y-coordinate j.

3. The method of compensating for pattern dimension variation caused by a re-scattered electron beam according to claim 1, wherein the predetermined reference value is determined as the largest value among the determined supplemental exposure dose for all sections.

4. The method of compensating for pattern dimension variation caused by a re-scattered electron beam according to claim 1, wherein the step of compensation-exposing comprises the step of compensation-exposing the electron beam resist according to predetermined compensation exposure patterns according to the compensation exposure dose for each section.

5. The method of compensating for pattern dimension variation caused by a re-scattered electron beam according to claim 4, wherein the compensation exposure patterns comprise parallel line patterns having widths proportional to the compensation exposure dose.

6. The method of compensating for pattern dimension variation caused by a re-scattered electron beam according to claim 4, wherein the compensation exposure patterns comprise a number of square areas proportional to the compensation exposure dose of each section divided into predetermined square areas.

7. The method of compensating for pattern dimension variation caused by a re-scattered electron beam according to claim 4, wherein the spot of the electron beam on the surface of the electron beam resist is sufficiently widened when the electron beam resist is compensation-exposed according to the compensation exposure patterns that the compensation exposure patterns are not developed on the electron beam resist.

8. A recording medium recorded on which a program for obtaining compensation exposure data for compensating for pattern dimension variation caused by a re-scattered electron beam when an electron beam resist is exposed to the electron beam with predetermined exposure patterns, is recorded, the program comprising:

a program module for dividing the predetermined exposure pattens into square sections and determining a dose of supplemental exposure to the re-scattered electron beam when adjacent sections are exposed, for each section;

a program module for determining a compensation exposure dose for each section by deducting the supplemental exposure dose of each section from a predetermined reference value; and a program module for setting-up compensation exposure patterns for each section with predetermined compensation exposure patterns so as to expose an area proportional to the compensation exposure dose for each section.

9. The recording medium according to claim 8, wherein the program module for determining the supplemental exposure dose of each section comprises:

a sub-program module for obtaining an exposure pattern density of each section; and a sub-program module for obtaining the supplemental exposure dose of each section according to the relationship:

$$\delta_{i,j} = \sum_{x=-\xi}^{\xi} \sum_{y=-\xi}^{\xi} D_{i+x,j+y} e^{-\frac{x^2+y^2}{\xi^2}}$$

wherein $\delta_{i,j}$ is a supplemental exposure dose of a section with x-coordinate i and y-coordinate j, and $\xi$ is a re-scattering range, and $D_{i,j}$ is an exposure pattern density of a section with x-coordinate i and y-coordinate j.

10. The recording medium according to claim 8, wherein the predetermined reference value is determined as the largest value among the supplemental exposure doses for all sections.

11. The recording medium according to claim 8, wherein the compensation exposure patterns comprise parallel line patterns having widths proportional to the compensation exposure dose.

12. The recording medium according to claim 8, wherein the compensation exposure patterns comprise a number of square areas proportional to the compensation exposure dose of each section divided into predetermined square areas.

* * * * *